United States Patent
Miyoshi

(10) Patent No.: US 7,556,711 B2
(45) Date of Patent: Jul. 7, 2009

(54) SEMICONDUCTOR DEVICE MANUFACTURING APPARATUS AND OPERATING METHOD THEREOF

(75) Inventor: Hidenori Miyoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 454 days.

(21) Appl. No.: 11/473,159

(22) Filed: Jun. 23, 2006

(65) Prior Publication Data
US 2006/0289297 A1    Dec. 28, 2006

(30) Foreign Application Priority Data
Jun. 24, 2005    (JP)    ............................. 2005-184754

(51) Int. Cl.
  *C23F 1/00*    (2006.01)
  *H01L 21/306*    (2006.01)
(52) U.S. Cl. .............................. 156/345.1; 156/345.11; 156/345.17; 156/345.21
(58) Field of Classification Search ........................ None
See application file for complete search history.

(56) References Cited
U.S. PATENT DOCUMENTS 3,661,660 A * 5/1972 Wessells et al. ............. 430/309
5,474,644 A * 12/1995 Kato et al. ............. 156/345.11
6,805,754 B1 * 10/2004 Pokorny et al. ................ 134/36

FOREIGN PATENT DOCUMENTS

JP     2003-218198     7/2003

* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

A semiconductor device manufacturing apparatus is disclosed. The semiconductor device manufacturing apparatus applies a process to a semiconductor wafer by supplying a vapor of a corrosive liquid source to a processing container. An electrode is immersed in a storing container which stores the corrosive liquid source. The main material of the electrode is a metal whose ionization tendency is less than that of a metal of the storing container, and a protection current is applied between them by a DC power source. Or another electrode is used. The main material of the electrode is a metal whose ionization tendency is greater than that of the metal of the storing container and the metal of the electrode does not damage the semiconductor wafer. A protection current is applied between the storing container and the electrode by utilizing the difference of the ionization tendency between them.

10 Claims, 4 Drawing Sheets

SEMICONDUCTOR DEVICE MANUFACTURING APPARATUS AND OPERATING METHOD THEREOF

BACKGROUND OF THE INVENTION

1. Field of the Invention

The present invention relates to a semiconductor device manufacturing apparatus and an operating method thereof in which a process is applied to an object to be processed, for example, a reduction process is applied to a metal oxide, or a cleaning process is applied to the inside of a processing container, by supplying a vapor of a corrosive liquid source to the processing container.

2. Description of the Related Art

There is a case where a process is performed by using a vapor of a corrosive liquid source in a semiconductor device manufacturing apparatus which provides a processing container so as to apply a process to a substrate. As an example, there is a process which reduces a surface oxide layer of copper wiring by using an organic acid. This process is described in detail. When copper multi-layer wiring is formed, in order to connect a lower copper layer to an upper copper layer, a via hole is formed in a dielectric interlayer, and an electrode is formed by filling the via hole with copper. The surface of the lower copper wiring is oxidized by the atmosphere after forming the via hole. That is, an oxide layer is formed on the surface of the lower copper wiring. However, when the via hole is filled by the copper electrode in this state, the resistance value between the copper wiring and the copper electrode becomes large. In Patent Document 1, in order to decrease the resistance value, a processing chamber is provided in which chamber a vaporized carboxylic acid such as a formic acid is supplied and the copper oxide is reduced.

A container which stores, for example, the formic acid is generally formed of a stainless steel (SUS) having high corrosion resistance. If quartz or resin is used for the container, it is difficult to form an airtight connecting structure between the container and a pipe used for supplying the formic acid, because the pipe is generally made of metal.

However, when the formic acid is stored in the stainless steel container, a metal component in the stainless steel is dissolved in the formic acid. A metal component such as iron in the stainless steel is ionized (oxidized) by an electrochemical reaction due to corrosion potential. That is, when an oxidization reaction ($M \rightarrow M^{n+} + ne^-$) of a metal M is studied, the equilibrium potential E of the metal M is shown in Equation (1) (Nernst Equation).

$$E = E^0 + RT/nF \cdot \ln a \quad (1)$$

where R is the gas constant (8.314 J/mol K), T is the absolute temperature, "n" is the number of concerned electrons, F is the Faraday constant (96500 C/mol), "a" is the activity of the metal ion $M^{n+}$, and the $E^0$ is the reference electrode potential (equilibrium potential when a metal is immersed in a solution of "a"=1). When the metal potential is greater than the equilibrium potential E, corrosion theoretically occurs due to the progress of the ionization of the metal. In the above system, the electric potential of the stainless steel is greater than the equilibrium potential E. The value of the equilibrium potential E is calculated by using an acceptable metal impurity concentration (approximately $10^{-6}$ to $10^{-8}$; approximately 100 to 1 ppb) in the formic acid liquid as the value of "a".

As described above, when a metal component in the stainless steel is dissolved in the formic acid liquid, a part of the metal component is included in a vapor of the formic acid liquid and the part of the metal component is permeated into a semiconductor wafer in the processing container. Consequently, metal contamination occurs in the semiconductor wafer. The characteristics of the semiconductor wafer are greatly affected by even a small amount of the metal contamination. Consequently, the yield of a semiconductor device may be decreased by the metal contamination. When the processing container is cleaned, the vapor of a corrosive liquid source is also used for cleaning the processing container. In this case, a metal component is absorbed on a table, and when a semiconductor wafer is put on the table, the metal component is absorbed on the backside surface of the semiconductor wafer. With this, the metal component is absorbed by another semiconductor device manufacturing apparatus and the metal contamination occurs in the semiconductor wafer.

[Patent Document 1] Japanese Laid-Open Patent Application No. 2003-218198, Paragraph 0018

SUMMARY OF THE INVENTION

The present invention provides a semiconductor device manufacturing apparatus and an operating method thereof in which metal contamination of an object to be processed caused by a metal component dissolved in a corrosive liquid source can be prevented in the semiconductor device manufacturing apparatus which performs a process by supplying a vapor of the corrosive liquid source to a processing container.

According to one aspect of the present invention, there is provided a semiconductor device manufacturing apparatus which provides a processing container for applying a process to an object to be processed for manufacturing a semiconductor device, and applies a process to the object or cleans the inside of the processing container by supplying a vapor of a corrosive liquid source in the processing container. The semiconductor device manufacturing apparatus includes a storing container made of a metal which stores the corrosive liquid source and generates the vapor of the corrosive liquid source, a supplying route which supplies the vapor of the corrosive liquid source to the processing container, and a unit which applies a protection current into the storing container.

As an example, the unit which applies the protection current into the storing container (protection current applying unit) can be formed by an external power source method. In the external power source method, the protection current applying unit includes a metal electrode a part of which is immersed in the corrosive liquid source in the storing container, and a DC power source whose negative electrode is connected to the storing container and whose positive electrode is connected to the electrode. It is preferable that the metal electrode be made of a material whose main material is a metal where the ionization tendency of the metal of the electrode is less than that of the metal of the storing container.

In addition, as another example, the protection current applying unit can be formed by an anodic protection method. In the anodic protection method, the protection current applying unit includes an electrode a part of which is immersed in the corrosive liquid source in the storing container, and whose main material is a metal whose ionization tendency is greater than that of the metal of the storing container, and which metal of the electrode does not damage the semiconductor device, and runs a corrosive preventive current between the storing container and the electrode by utilizing the difference of the ionization tendency between the storing container and the electrode.

The electrode whose main material is a metal whose ionization tendency is small is made of the metal itself, or made of a conductive material such as a compound of the metal, and an alloy including the metal. The electrode whose main material is a metal whose ionization tendency is large is the same as the above. In the anodic protection method, the metal which does not damage the semiconductor device is a case in which the semiconductor device does not become a defective device even if the metal is dissolved into the corrosive liquid source and the dissolved metal is mixed into the semiconductor device disposed in the processing container with the vapor of the corrosive liquid source while the semiconductor device is being manufactured.

The process by the vapor of the corrosive liquid source is a cleaning process to remove (reduce) a metal oxide film formed on the object to be processed. It is preferable that the electrode be made of the same metal as main material of a thin film which is subsequently formed after the cleaning process. As an example of the metal oxide, there is a metal oxide (copper oxide) on copper wiring or a copper electrode.

The metal of which the storing container is made is stainless steel, and the process by the vapor of the corrosive liquid source is a cleaning process to remove (reduce) a metal oxide film formed on the object to be processed. When the external power source method is used, the main material of the electrode may be a metal of tantalum, tungsten, or ruthenium which is the same metal of a main material of a thin film which is subsequently formed after the cleaning process. In addition, when the anode protection method is used, the main material of the electrode may be a metal of titanium which is the same metal of a main material of a thin film which is subsequently formed after the cleaning process. An example of the thin film forming process which is subsequently performed after the cleaning process is described. When a semiconductor device having a multi-layer structure is manufactured, after a cleaning process is applied to a metal oxide on the surface of metal wiring, a barrier metal film (thin film) is formed in a dielectric interlayer in order not to diffuse a component of the metal wiring. As the material of the electrode, in addition to tantalum, a nitride of a metal such as tantalum can be used.

When the electrode is made of a material whose main material is a metal which is the same metal as a main material of a thin film which is subsequently formed after the cleaning process, no damage is done to the semiconductor device. Therefore, when a metal of the electrode does not damage the semiconductor device, another material such as Si, which is different from that of the barrier metal film, can be used. In this, Si is treated as a kind of metal.

The example of the corrosive liquid source is an organic acid, and the organic acid is supplied to reduce the metal oxide on the surface of wiring or an electrode of the object to be processed.

According to another aspect of the present invention, there is provided an operating method of a semiconductor device manufacturing apparatus which provides a processing container for applying a process to an object to be processed for manufacturing a semiconductor device. The operating method includes the steps of applying a process to the object to be processed or cleaning the inside of the processing container by supplying a vapor of a corrosive liquid source stored in a storing container made of a metal to the processing container, and applying a protection current into the storing container.

The protection current is supplied by a DC power source whose negative electrode is connected to the storing container and whose positive electrode is connected to an electrode a part of which is immersed in the corrosive liquid source in the storing container. Or the protection current is a current applied between an electrode and the storing container in which a part of the electrode is immersed in the corrosive liquid source in the storing container, where a main material of the electrode is a metal whose ionization tendency is greater than that of the metal of the storing container and the metal of the electrode, which metal does not damage the semiconductor device, by utilizing the difference of the ionization tendencies between the storing container and the electrode.

According to embodiments of the present invention, since a protection current applies to a storing container, made of a metal, which stores a corrosive liquid source, a metal component of the storing container can be prevented from being dissolved in the corrosive liquid source. Consequently, since the metal component is prevented from entering a processing container with a vapor of the corrosive liquid source, metal contamination of a semiconductor device caused by the metal component can be prevented. When an external power source method which runs a current between an insoluble electrode and the storing container is used, since the dissolution of the metal does not substantially occur, the metal contamination of the semiconductor device can be surely prevented. In addition, when an anodic protection method is used, a potential difference between a metal of the storing container and a metal whose ionization tendency is greater than that of the metal of the storing container, and a metal component of the electrode is dissolved; however, since a metal which does not damage the semiconductor device can be selected as the metal of the electrode, the same effect as described above can be obtained.

In addition, in a thin film forming process using a metal which process is subsequently performed after a cleaning process by a vapor of the corrosive liquid source, for example, when the main material of the electrode is the same as that of a barrier metal film in a multi-layer structure of the semiconductor device, even if the metal of the electrode is dissolved, the metal contamination of the semiconductor device does not occur.

Other advantages and further features of the present invention will become apparent from the following detailed description when read in connection point with the accompanying drawings.

DETAILED DESCRIPTION OF THE PREFERRED EMBODIMENTS

Figure 1:
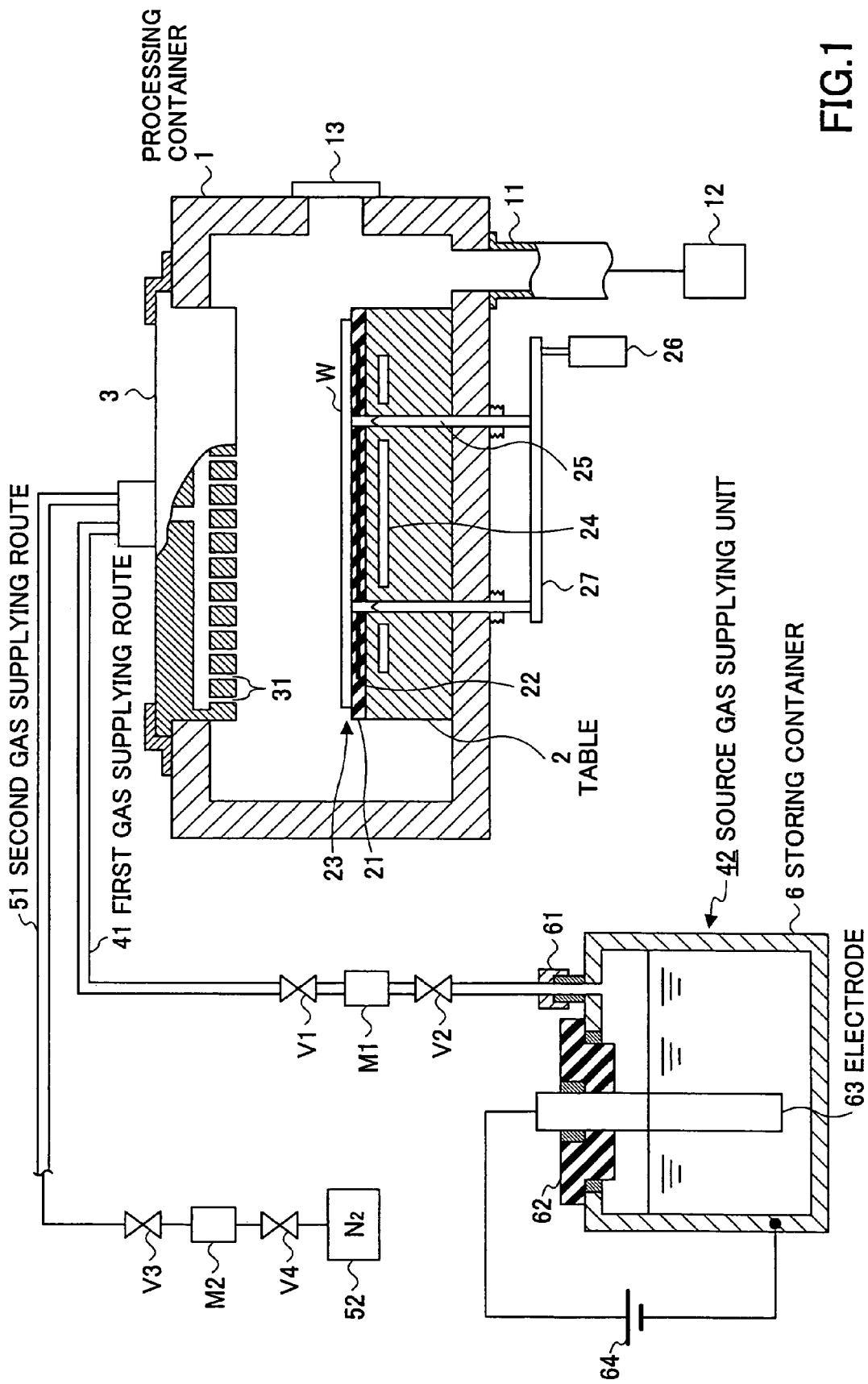
FIG. 1 is a structural diagram of a semiconductor device manufacturing apparatus according to an embodiment of the present invention.

Referring now to the drawings, embodiments of the present invention are described.

FIG. 1 is a structural diagram of a semiconductor device manufacturing apparatus according to an embodiment of the present invention. In FIG. 1, a processing container 1 which is a vacuum chamber is made of, for example, aluminum. A table 2, on which a semiconductor wafer W (an object to be processed) from which a semiconductor device is formed is put, is disposed on the bottom surface of the processing container 1. On the surface of the table 2, an electrostatic chuck 23 which is formed by embedding a chuck electrode 22 in a dielectric layer 21 is disposed, and a chuck voltage is applied to the electrostatic chuck 23 from a power source (not shown). In the table 2, a heater 24 which is a temperature adjusting unit is disposed, and a lifting pin 25 is disposed movably in the up and down directions to receive and send the semiconductor wafer W. A driving section 26 operates the lifting pin 25 via a sustaining member 27.

At the upper part of the processing container 1, a gas shower head 3 which is a gas supplying section is disposed to face the table 2. Many gas supplying holes 31 are formed in the lower surface of the gas shower head 3. A first gas supplying route 41 for supplying a source gas (vapor of a corrosive liquid source) and a second gas supplying route 51 for supplying a diluting gas are connected to the gas shower head 3. In the gas shower head 3, the source gas and the diluting gas are mixed and the mixed gas is supplied to the processing container 1 via the gas supplying holes 31.

The first gas supplying route 41 is connected to a source gas supplying unit 42 via a valve V1, a mass flow controller M1 which is a vapor flow rate adjuster, and a valve V2. The second gas supplying route 51 is connected to a diluting gas supplying unit 52 which supplies, for example, an $N_2$ gas via a valve V3, a mass flow controller M2, and a valve V4.

One end of an exhaust pipe 11 is connected to the bottom of the processing container 1, and the other end of the exhaust pipe 11 is connected to a vacuum pump 12 which evacuates exhaust by vacuum. A gate valve 13 for opening/closing a carrying window for the semiconductor wafer W is disposed in the side wall of the processing container 1.

The source gas supplying unit 42 is described in detail. The source gas supplying unit 42 provides a storing container 6 made of a metal, for example, stainless steel, and the storing container 6 stores a corrosive liquid source, for example, a formic acid liquid.

A connecting section 61 including a screw structure is formed on the upper surface of the storing container 6, and the storing container 6 has an airtight connection to the first gas supplying route 41 made of a metal pipe, for example, a stainless steel pipe via the connecting section 61. An insulation joint 62 is formed at the upper part of the storing container 6. A column-shaped insoluble metal electrode 63 penetrates the insulation joint 62 to be immersed in the formic acid liquid in the storing container 6. A ceramic insulation sealing member made of, for example, alumina is disposed between the insulation joint 62 and the upper part of the storing container 6 and between the metal electrode and the insulation joint 62. With this, the storing container 6 is formed as an airtight space. The formic acid liquid can be heated by a heating unit, for example, by disposing a heater at the outer circumference of the storing container 6. The storing container 6 is connected to a negative electrode of a DC power source 64, the metal electrode is connected to a positive electrode of the DC power source 64, and a protection current is applied between the metal electrode and the storing container 6. In the above example, the metal electrode and the DC power source 64 form a protection current applying unit for the storing container 6.

The metal electrode is preferably made of a metal whose ionization tendency is less than that of stainless steel of which the storing container 6 is made. That is, the metal electrode is preferably made of a material whose main component is a metal whose ionization tendency is less than that of a metal such as Fe, Cr, Ni, and Mo of which the stainless steel is formed, the metal only, a nitride of the metal, a compound of the metal, or an alloy including the metal. As an example, the metal electrode is formed by plating platinum on titanium or is made of graphite. In a case where a process by a vapor of a corrosive liquid source is to remove (reduce) an oxide of a wiring metal, when the metal electrode is made of the same metal as a barrier metal which is used to form a barrier metal film, the metal contamination of the semiconductor wafer can be avoided. As the material for the barrier metal film, tantalum (Ta) and tungsten (W) are acceptable, and the ionization tendencies of Ta and W are less than that of the metals of which the stainless steel is formed. Therefore, if there is a risk that the metal electrode may be slightly dissolved in the formic acid liquid, when the material of the barrier metal film is a Ta type or a W type, it is preferable that the material of the metal electrode be the same material of the barrier metal film. The Ta type material and the W type material include not only Ta only and W only, but also a nitride of the metal, a compound of the metal and an alloy of the metal. In addition, the metal electrode can be made of ruthenium (Ru) whose ionization tendency is less than that of the metal in the stainless steel. The wiring metal and the barrier film metal are described below in detail.

Figure 2:
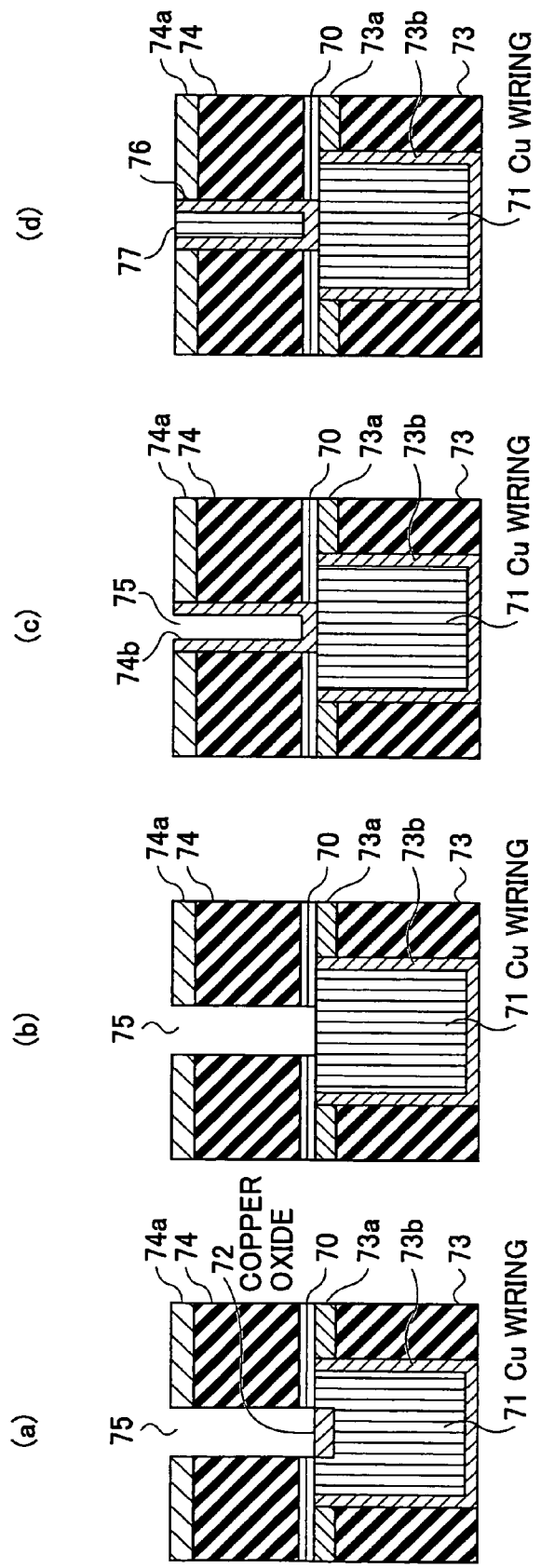
FIG. 2 is a diagram showing processes in which a multi-layer wiring structure of a semiconductor device is formed in a semiconductor wafer according to the embodiment of the present invention.

Next, operations of the present embodiment are described. First, the semiconductor wafer W which is an object to be processed is carried in the processing container 1 by a carrying arm (not shown) by opening the gate valve 13. The semiconductor wafer W is put on the table 2 by the operation of the lifting pin 25, and is electrostatically held by the electrostatic chuck 23. FIG. 2 is a diagram showing processes in which a multi-layer wiring structure of a semiconductor device is formed in a semiconductor wafer according to the embodiment of the present invention. As shown in FIG. 2($a$), the surface of a Cu wiring 71 is oxidized and a copper oxide 72 is formed. Cu is supplied in a groove formed in a dielectric interlayer 73 (lower layer; $n^{th}$ layer) made of, for example, a SiOC film or a fluorine added carbon film and the surface of the Cu is planarized by a CMP method; then the Cu wiring 71 is formed. Next, a dielectric interlayer 74 (upper layer; $n+1^{th}$ layer) is formed and a hole 75 in which Cu is filled is formed. The semiconductor wafer W is in this state when being carried in the processing container 1. In FIG. 2, an etching stopper 70 is formed by a thin film made of, for example, SiN, SiC, or SiCN so as to stop the etching at the dielectric interlayer 74. Hard masks 73$a$ and 74$a$ made of, for example, a silicon nitride, function as etching masks for the fluorine added carbon films (dielectric interlayers 73 and 74). A barrier metal film 73$b$ prevents Cu of the Cu wiring 71 from diffusing into the dielectric interlayer 73, and is made of, for example, a Ta type material or a W type material.

When the semiconductor wafer W is carried in the processing container 1, the inside of the processing container 1 is evacuated to a predetermined vacuum level by the vacuum pump 12, and then the valves V1 and V3 are opened. For the sake of convenience, it is described that the gas supplying routes 41 and 51 are opened/closed by the valves V1 and V3; however, an actual pipe arrangement is complex and the gas supplying routes 41 and 51 are actually opened/closed by shut-off valves. When the processing container 1 is connected to the storing container 6 by opening the first gas supplying route 41, the formic acid liquid is vaporized by pressure reduction in the storing container 6, and the vapor (source gas) runs into the mass flow controller M1 and the flow rate is controlled. The flow rate controlled gas runs into the gas shower head 3 via the first gas supplying route 41.

On the other hand, the diluting gas ($N_2$ gas) from the diluting gas supplying unit 52 runs into the mass flow controller M2 and the flow rate is controlled. The flow rate controlled diluting gas runs into the gas shower head 3 via the second gas supplying route 51. The vapor of the formic acid liquid and the $N_2$ gas are mixed in the gas shower head 3 and the mixed gas is supplied to the processing container 1 via the gas supplying holes 31, so that the mixed gas contacts the semiconductor wafer W. At this time, the semiconductor wafer W is heated to, for example, 100 to 400° C. by the heater 24, and the process pressure in the processing container 1 is maintained in the range, for example, of 0.1 to $10^5$ Pa.

The copper oxide 72 including a cuprous oxide at the surface of the Cu wiring 71 is reduced by the formic acid as shown in reaction Equations (2) and (3).

$$HCOOH + CuO \rightarrow Cu + CO_2 + H_2O \quad (2)$$

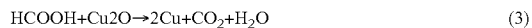

$$HCOOH + Cu2O \rightarrow 2Cu + CO_2 + H_2O \quad (3)$$

As shown in FIG. 2(b), the copper oxide 72 at the surface of the Cu wiring 71 is reduced and the surface of the Cu wiring 71 is cleaned.

Figure 3:
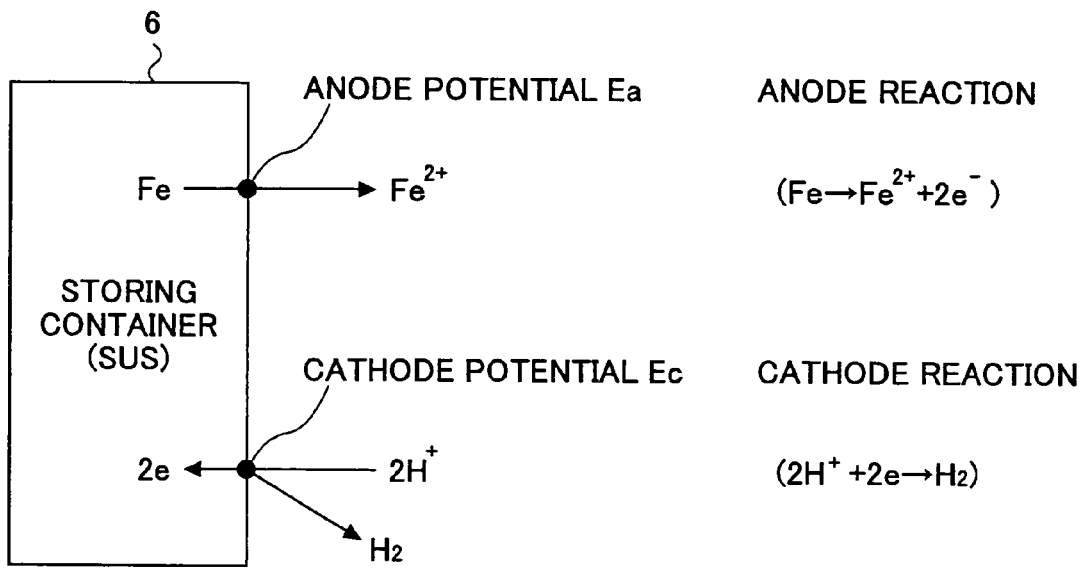
FIG. 3 is a schematic diagram showing a corrosion principle of a metal.
Figure 4:
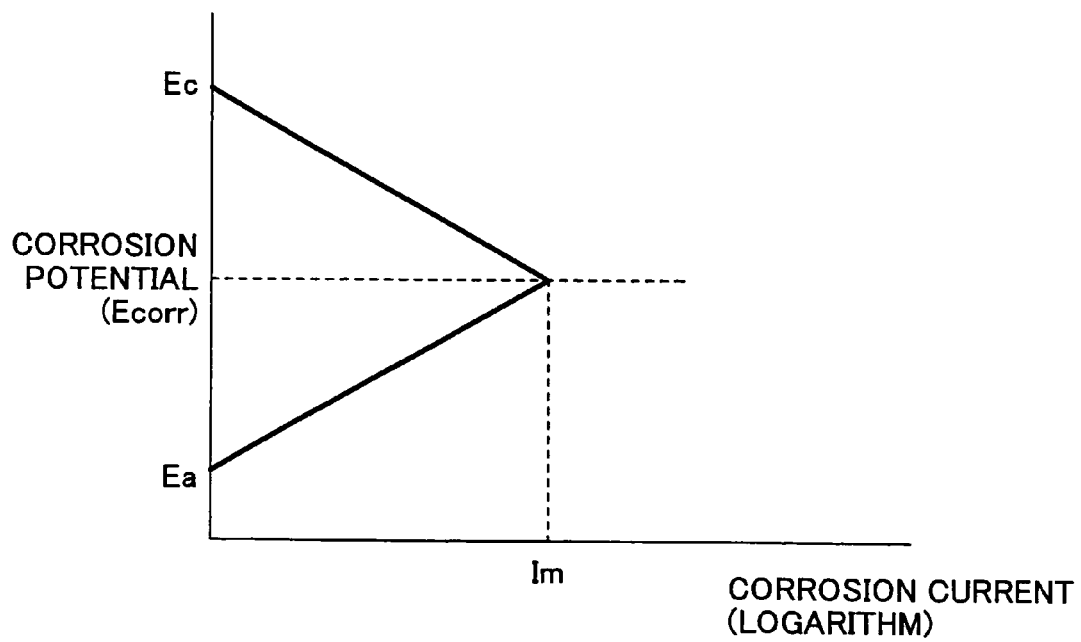
FIG. 4 is a graph showing a relationship between a corrosion current and corrosion potential.

On the other hand, a voltage, for example, −1 to −10 V is applied to the storing container 6 which stores the formic acid liquid in the source gas supplying unit 42, so that a protection current flows and a corrosion protection process is applied to the storing container 6. FIG. 3 is a schematic diagram showing a corrosion principle of a metal. FIG. 4 is a graph showing a relationship between a corrosion current and corrosion potential. Referring to FIGS. 3 and 4, the corrosion preventive process is described. The corrosion of the stainless steel of which the storing container 6 is formed is described by using an example of Fe dissolution. As shown in FIG. 3, an anode oxidization reaction ($Fe \rightarrow Fe^{2+} + 2e^-$) occurs in a manner so that electronegative potential becomes anode potential and a cathode reduction reaction ($2H^+ + 2e \rightarrow H_2$) occurs in a manner so that electropositive potential becomes cathode potential. With this, corrosion occurs.

In FIG. 4, a relationship between a corrosion current Im and anode potential Ea and cathode potential Ec is shown. The anode potential Ea attempts to approach the cathode potential Ec by polarizing, and the cathode potential Ec attempts to approach the anode potential Ea by polarizing. When the anode potential Ea and the cathode potential Ec reach the same electric potential (corrosion electric potential Ecorr), the corrosion current Im flows and the corrosion occurs.

In order to solve this problem, the DC power source 64 is disposed between the storing container 6 and the metal electrode so that the side of the storing container 6 becomes negative polarity. With this, the electric potential of the storing container 6 is changed in the minus direction (Ea direction) and becomes electric potential close to the anode potential Ea, and the corrosion current becomes zero, that is, an inactive state is realized. In other words, in Nernst Equation (1), the electric potential of the stainless steel (the storing container 6) becomes less than the equilibrium potential; that is, the protection current flows in the cathode of the corrosion battery and the potential difference between the anode and the cathode becomes small. With this, the corrosion current is decreased.

The semiconductor wafer W applied the formic acid process is sent out from the processing container 1 and as shown in FIG. 2(c), a barrier metal film 74b is formed. Further, as shown in FIG. 2(d), a Cu electrode 77, which connects the Cu wiring 71 to upper Cu wiring (not shown), is formed. In FIG. 2, the description of the reference number 76 is omitted.

As described above, according to the present embodiment, electric corrosion prevention is performed by a so-called external power source method in which the protection current of the DC power source 64 flows through the stainless steel storing container 6 which stores the formic acid liquid. Therefore, the dissolution of the metal component of the storing container 6 into the formic acid liquid can be prevented. Further, according to the external power source method, the metal component is not substantially dissolved in the storing container 6. Therefore, the metal component is prevented from entering the processing container 1 by being carried with the vapor of the formic acid liquid; with this, the metal contamination of the semiconductor device can be prevented. As described above, in a case where the barrier metal film 74b formed after the cleaning process by the formic acid is made of a Ta type material or a W type material, when the metal electrode is made of the same material as the barrier metal film 74b, even if the metal component is absorbed on the semiconductor wafer W by being contained in the vapor of the formic acid, the metal component can a part of the barrier metal film 74b. Therefore, the metal contamination of the semiconductor wafer W does not occur.

Figure 5:
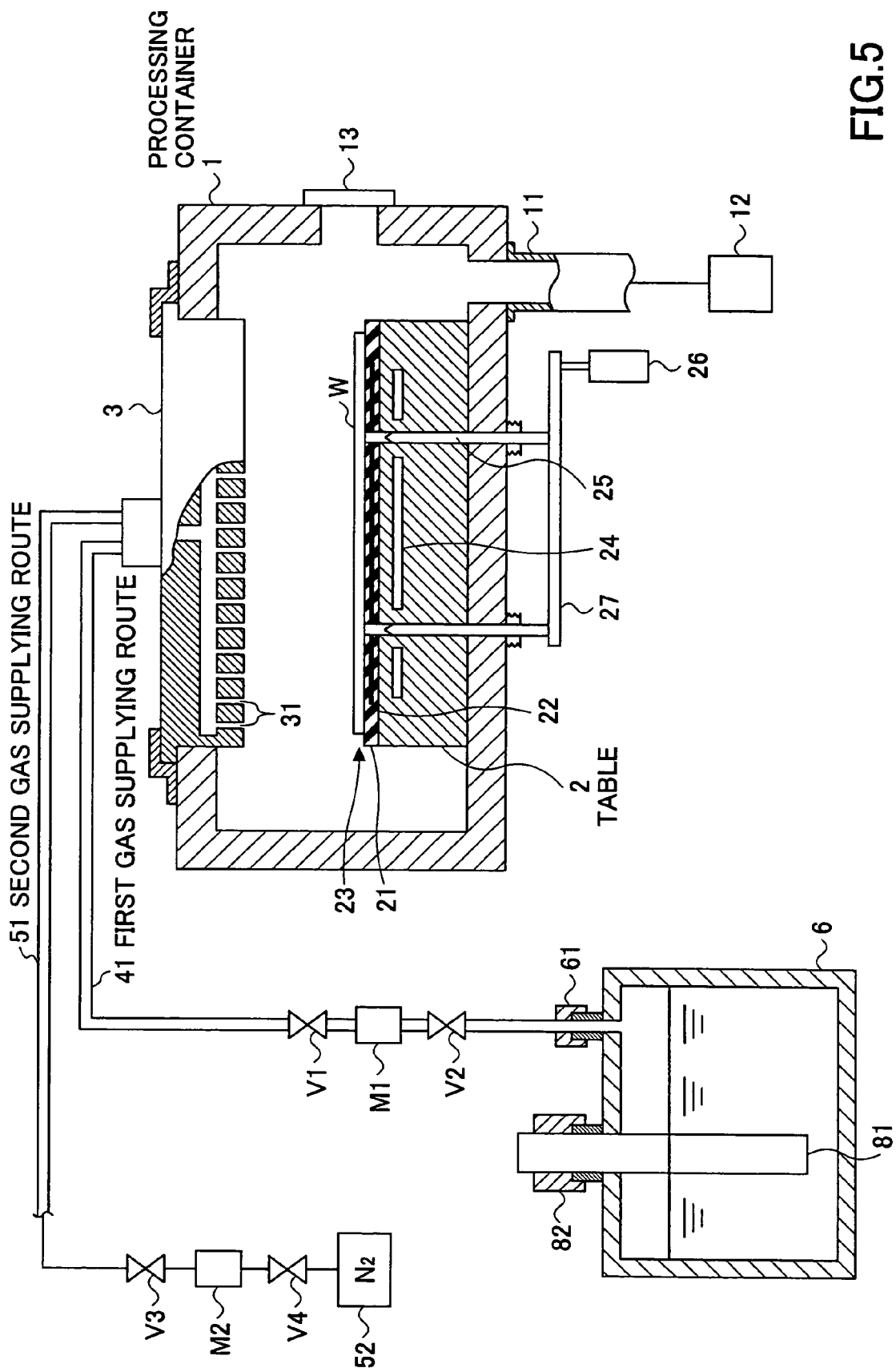
FIG. 5 is a structural diagram of a semiconductor device manufacturing apparatus according to another embodiment of the present invention.

Next, referring to FIG. 5, another embodiment of the present invention is described.

FIG. 5 is a structural diagram of a semiconductor device manufacturing apparatus according to another embodiment of the present invention. In the present embodiment, as the electric corrosion preventing method, a so-called anodic protection method is used. That is, a rod-shaped metal electrode 81 penetrates the upper surface of the storing container 6 and is fixed by a fixing section 82 to the storing container 6. The storing container 6 is maintained airtight and the rod-shaped metal electrode 81 is immersed in the formic acid liquid. The material of the rod-shaped metal electrode 81 must be a metal whose ionization tendency is greater than that of the stainless steel of which the storing container 6 is made.

According to the above method, since the storing container 6 contacts the rod-shaped metal electrode 81, a protection current flows in a loop (the storing container 6→the rod-shaped metal electrode 81→the liquid source→the storing container 6) by the potential difference between the storing container 6 and the rod-shaped metal electrode 81. The electric potential of the storing container 6 is changed in the minus direction similar to the external power source method so that the corrosion preventing can operate. With this, the metal component is prevented from being dissolved in the storing container 6, and the metal contamination of the semiconductor device can be prevented.

In this case, since the metal component of the rod-shaped metal electrode 81 may be dissolved into the liquid source, the rod-shaped metal electrode 81 must be made of a metal material which does not damage the semiconductor device. When the barrier metal film which is subsequently formed after cleaning the Cu oxide is made of Ti or TiN, since the ionization tendency of Ti is greater than that of the metal component of the stainless steel, it is preferable to use Ti for the rod-shaped metal electrode 81. As the metal of the rod-shaped metal electrode 81, for example, Zr or Al can be used. In the process for forming, for example, a ZrN film after the cleaning process, even if Zr is used for the rod-shaped metal electrode 81, there is no risk of the metal contamination caused by Zr.

The timing of the cleaning process for the Cu oxide is not limited to timing after opening an electrode embedding hole by etching an upper dielectric interlayer. For example, a Cu film which becomes Cu wiring is formed and a CMP method is applied to the Cu film; soon after that, the cleaning process is applied to the Cu layer. In addition, the semiconductor device manufacturing apparatus can serve both as a cleaning apparatus and a film forming apparatus.

In this case, the barrier metal film is formed after removing (reducing) the Cu oxide by adding a barrier metal film forming gas supplying system.

The diluting gas is not limited to the $N_2$ gas; an Ar gas or a He gas can be used. Further, the diluting gas may be omitted. In addition, in order to obtain a vapor by vaporizing a liquid source, a carburetor may be disposed in the first gas supplying route 41 so that the liquid source is vaporized by the carburetor. Or the liquid source may be vaporized by bubbling the liquid source by supplying an inert gas to the storing container 6. The material of the storing container 6 is not limited to the stainless steel; for example, Hastelloy may be used for the storing container 6.

The removing (reducing) process for the metal oxide by using the liquid source is not limited to the metal oxide on the wiring metal and can be applied to a metal oxide formed on the surface of an electrode. The organic acid for removing (reducing) the metal oxide is not limited to the formic acid; an acetic acid, a propionic acid, a butyric acid, a valerianic acid, a carboxylic acid such as a citric acid, and an oxalic acid may be used. In addition, the corrosive liquid source is not limited to an organic acid; an inorganic acid such as a hydrofluoric acid may be used. The process by the vapor of the corrosive liquid source is not limited the above described process, and can be applied to an etching process for the surface of a substrate, or a thin film forming process on the surface of a substrate.

An example of an etching process is described. When dry etching is applied to an Al film by using $SiCl4$ as the liquid source, Al is used for a corrosion preventing electrode. In this case, since the ionization tendency of Al is greater than that of stainless steel, an anodic protection method is preferably used. In addition, an example of a film forming process is described. When a Ti film or a TiN film is formed by using $TiCl4$ as the liquid source and then W is filled in, the external power source method can be applied by using W as an electrode.

In addition, the embodiments of the present invention can be applied to a cleaning process which cleans the inner walls of the processing container 6 after a film forming process. Further, the embodiments of the present invention can be applied to a cleaning process which cleans the surface of a Cu electrode of a chip before bonding the Cu electrode to a Cu electrode of a substrate by using solder in the final process in manufacturing the semiconductor device.

Further, the present invention is not limited to the embodiments, but variations and modifications may be made without departing from the scope of the present invention.

The present application is based on Japanese Priority Patent Application No. 2005-184754 filed on Jun. 24, 2005, with the Japanese Patent Office, the entire contents of which are hereby incorporated by reference.

What is claimed is:

1. A semiconductor device manufacturing apparatus which provides a processing container for applying a process to an object to be for manufacturing a semiconductor device and applies a process to the object or cleans the inside of the processing container by supplying a vapor of a corrosive liquid source in the processing container, comprising:
   a metal storing container which stores the corrosive liquid source and generates the vapor of the corrosive liquid source;
   a supplying route which supplies the vapor of the corrosive liquid source to the processing container; and
   a protection current applying unit which applies a protection current through the storing container.

2. The semiconductor device manufacturing apparatus as claimed in claim 1, wherein:
   the protection current applying unit includes an electrode partially immersed in the corrosive liquid source in the storing container, and a DC power source whose negative electrode is connected to the storing container and whose positive electrode is connected to the electrode.

3. The semiconductor device manufacturing apparatus as claimed in claim 2, wherein:
   the electrode is made of a material whose main material is a metal and the ionization tendency of the metal of the electrode is less than that of the metal of the storing container.

4. The semiconductor device manufacturing apparatus as claimed in claim 1, wherein:
   the protection current applying unit includes an electrode partially immersed in the corrosive liquid source in the storing container, the electrode main material being a metal whose ionization tendency is greater than that of the metal of the storing container, and which metal of the electrode does not damage the semiconductor device, and runs a corrosive preventive current between the storing container and the electrode by utilizing the difference of the ionization tendency between the storing container and the electrode.

5. The semiconductor device manufacturing apparatus as claimed in claim 2, wherein:
   the vapor of the corrosive liquid source performs a cleaning process to remove a metal oxide film formed on the object to be processed, and
   the main material of the electrode is the same as that of a thin film which is formed after the cleaning process.

6. The semiconductor device manufacturing apparatus as claimed in claim 2, wherein:
   the metal of the storing container is stainless steel;
   the vapor of the corrosive liquid source performs a cleaning process to remove a metal oxide film formed on the object to be processed; and
   the main material of the electrode is one of a metal of tantalum, tungsten, and ruthenium which is a metal main material of a thin film which is formed after the cleaning process.

7. The semiconductor device manufacturing apparatus as claimed in claim 4, wherein:
   the metal of the storing container is stainless steel;
   the vapor of the corrosive liquid source performs a cleaning process to remove a metal oxide film formed on the object to be processed; and
   the metal main material of the electrode is titanium which is a metal main material of a thin film which is formed after the cleaning process.

8. The semiconductor device manufacturing apparatus as claimed in claim 1, wherein:
   the vapor of the corrosive liquid source performs a cleaning process to remove a copper oxide film formed on the object to be processed.

9. The semiconductor device manufacturing apparatus as claimed in claim 1, wherein:
   the corrosive liquid source is an organic acid.

10. The semiconductor device manufacturing apparatus as claimed in claim 9, wherein:
    the organic acid is supplied to reduce the metal oxide on the surface of wiring or an electrode of the object to be processed.

* * * * *